US012155002B2

(12) United States Patent
De Vecchi et al.

(10) Patent No.: US 12,155,002 B2
(45) Date of Patent: Nov. 26, 2024

(54) METHOD FOR OPTIMIZING THE ELECTRIC CONDUCTION THROUGH A METAL/OXIDE/METAL INTERFACE

(71) Applicant: Garmin Switzerland GmbH, Schaffhausen (CH)

(72) Inventors: Sylvain De Vecchi, Chambéry (FR); Brice Arrazat, Bouc Bel Air (FR)

(73) Assignee: Garmin Switzerland GmbH (CH)

( * ) Notice: Subject to any disclaimer, the term of this patent is extended or adjusted under 35 U.S.C. 154(b) by 491 days.

(21) Appl. No.: 17/456,052

(22) Filed: Nov. 22, 2021

(65) Prior Publication Data

US 2022/0085233 A1   Mar. 17, 2022

Related U.S. Application Data

(63) Continuation of application No. PCT/IB2019/054225, filed on May 22, 2019.

(51) Int. Cl.
*H01L 31/18* (2006.01)
*H02S 50/15* (2014.01)

(52) U.S. Cl.
CPC .......... *H01L 31/186* (2013.01); *H02S 50/15* (2014.12)

(58) Field of Classification Search
CPC .................. H01L 31/186; H02S 50/15
See application file for complete search history.

(56) References Cited

U.S. PATENT DOCUMENTS 4,806,496 A    2/1989  Suzuki et al.
2003/0062551 A1  4/2003  Chen
(Continued)

FOREIGN PATENT DOCUMENTS

CN    103746015 A    4/2014
FR    3074357 B1   12/2019
JP    2001085719 A    3/2001
(Continued)

OTHER PUBLICATIONS

Gupta Shashank et al.: "Contact resistivity reduction through interfacial layer doping in metal-interfacial layer-semiconductor contacts", Journal of Applied Physics, American Institute of Physics, US, vol. 113, No. 23, Jun. 21, 2013, pp. 234505-234505.
(Continued)

*Primary Examiner* — Dale E Page
*Assistant Examiner* — Colleen E Snow
(74) *Attorney, Agent, or Firm* — Samuel M. Korte; Max M. Ali

(57) ABSTRACT

A method for optimizing the electrical performance of all or part of a photovoltaic module (11) through breakdown at the metal/oxide/metal interface. The method may include: —Step 1: Illuminating all or part of said photovoltaic module with a luminous flux controlled by a control module (14); —Step 2: Reverse-biasing said photovoltaic module: by subjecting it to a voltage sweep ranging from $-V_{oc}/2$, Voc being the open-circuit voltage, to a limit bias voltage $V_L$ whose value depends on the mode of interconnection and on the number (NB) of cells forming all or part of said photovoltaic module.

11 Claims, 2 Drawing Sheets

(56) References Cited

U.S. PATENT DOCUMENTS

2014/0010027 A1* 1/2014 Fujiwara ................. G11C 7/12
365/189.09
2017/0301479 A1* 10/2017 Moehl ................. H01G 9/2018

FOREIGN PATENT DOCUMENTS

WO      2013112551 A3   9/2013
WO      2020234630 A1  11/2020

OTHER PUBLICATIONS

International Search Report from priority PCT/IB2019/054225, dated May 22, 2019.
Keithley Instruments et al.: "Keithley Application Note Series, No. 2876: Making I-V and C-V Measurements on Solar/Photovoltaic Cells Using the Model 4200-SCS Semiconductor Characterization System" Oct. 1, 2007, pp. 1-6.
Lashway, C: "Photovoltaic System Testing Techniques and Results", Sep. 1, 1988, IEEE Transactions on Energy Conversion, IEEE Service Center, Piscataway, NY, US, pp. 503-506.
S. Olweya et al.; "Fine-line Silver Pastes for Seed Layer Screen Printing with varied Glass Content", Energy Procedia, vol. 43, Jan. 1, 2013, p. 37-43.
Search Report from FR1701230, filed Nov. 24, 2017.

* cited by examiner

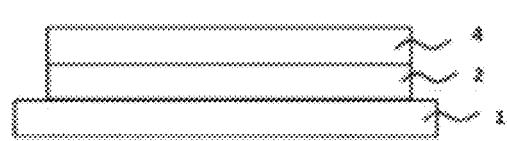
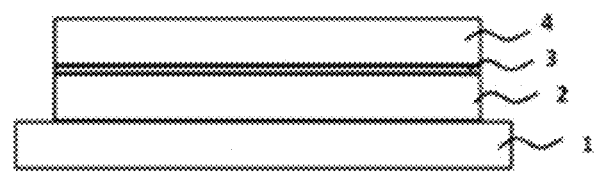
Fig. 1A
Fig. 1B
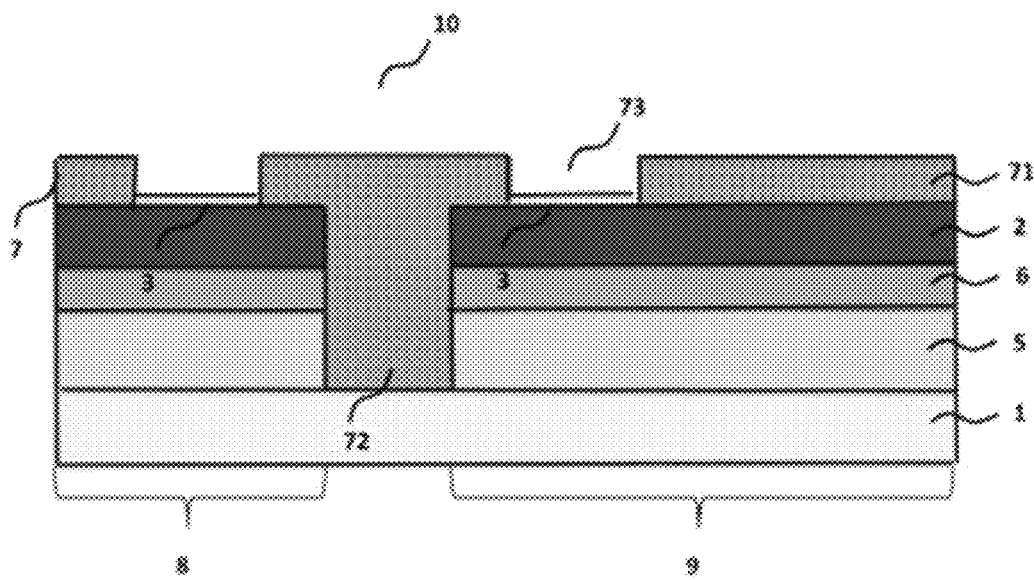
Fig. 2A
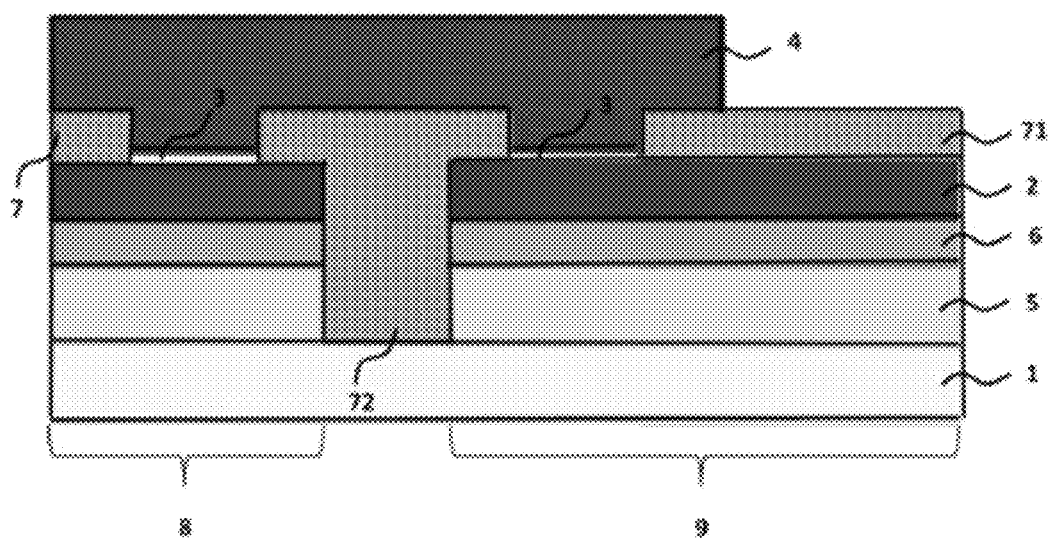
Fig. 2B

METHOD FOR OPTIMIZING THE ELECTRIC CONDUCTION THROUGH A METAL/OXIDE/METAL INTERFACE

RELATED APPLICATIONS

The present application is a continuation of, and claims priority benefit to, co-pending international application entitled, "METHOD FOR OPTIMIZING ELECTRICAL CONDUCTION THROUGH A METAL/NATIVE OXIDE/METAL INTERFACE," International Application No. PCT/IB2019/054225, filed May 22, 2019, which is hereby incorporated by reference into the current application in its entirety.

BACKGROUND

Embodiments of the present invention relate to a method for optimizing the electrical conduction through a metal/native oxide/metal interface, in particular in a photovoltaic module. It is directed more particularly, in the case of photovoltaic modules, to a method of sharing the step of intensity/potential (I(V)) measurement and the step of breakdown of the native oxide in order to eliminate the failed electrical contacts.

In the literature, a distinction is made among a plurality of types of semi-conductor materials used in photovoltaic devices, such as crystallized solid materials, organic materials (polymers or small molecules) or indeed inorganic thin layers (amorphous or polycrystalline). In most cases, a metal layer is used to collect the electrical charges generated by said devices under illumination. Said metal layers generally form an electrode, collector buses, or the interconnections between the different cells that make up the photovoltaic module. In the remainder of the document, only the photovoltaic devices having metal layers are considered.

In order to improve the performance of the photovoltaic modules, it is known to a person skilled in the art that increasing for example the thickness of the metal electrodes makes it possible to reduce the losses resulting from the Joule effect. In this case, it is therefore necessary to contact a metal A, that has been in the open air (the metal electrode of the initial cell), with another conductor B in order to thicken said electrode and thus increase the overall conductivity thereof. However, some metals, including aluminum (Al) and copper (Cu), which are commonly used to form, for example, the metal electrode of the thin-film photovoltaic devices, undergo surface oxidation in the open air, or indeed in atmospheres in which the oxygen levels are controlled. An oxide commonly referred to as a native oxide is formed. Said fine layer of native oxide, having a thickness of a few nanometers, is mostly electrically insulating. This is the case in particular for aluminum and copper oxides. In this case, the stack made up of the metal electrode A, the oxide thereof, and the conductor B, does not have an improved conductivity as hoped for due to the a posteriori thickening of the metal electrode, since the electrical contact resistance between the two metals is very significant. The same phenomenon is observed when attempting to place a plurality of photovoltaic cells in series or in parallel, a posteriori, in order to control the voltage and current levels at the output of the photovoltaic modules. In the same way as above, it is necessary to optimize the conductivity of the metal A/native oxide/metal B stack in order to maximize the performance of said modules. In the remainder of the document, metal A refers to the native metal present on the base structure, which is the basis for forming the native oxide. The metal B refers to the metal additionally added to the base structure in order to modify the performance and/or the architecture thereof.

In order to overcome this problem, a plurality of solutions are known to a person skilled in the art, and are used in the industrial field. For example, a first solution consists in performing treatment under plasma of the device containing the metal A, in order to suppress the native oxide therein. This surface treatment is conventionally referred to as "etch back." It is carried out under vacuum, and is followed immediately by deposition of the metal B under vacuum, in order that the native oxide cannot reform upon contact with air. The gases used for performing this step are often fluorinated or brominated compounds. These compounds are not only expensive, but also dangerous. The implementation of a solution of this kind thus requires investments in specific equipment, adding an additional production cost.

A second solution consists in adding a very fine layer of a stainless compound, such as gold, immediately following the deposition of the metal A. The deposition of the layer of gold may be carried out under vacuum, or by means of an ENIG ("Electrode Nickel Immersion Gold") method. This solution has the disadvantage of adding an additional step to the initial method for producing the device containing said metal A. It is described for example by S. Gupta's team in the article having the title "Contact resistivity reduction through interfacial layer doping in metal interfacial layer semi-conductor contacts" and published in the journal "Journal of Applied Physics" in 2013.

The two methods cited above both require the addition of a restricting step in order to prevent oxidation of the metal A prior to the deposition of the metal B. However, for reasons of production cost, it is not always possible to work under vacuum or to selectively deposit a fine layer of gold on a part of the device. In order to overcome this problem, another solution consists in considering the formation of the layer of native oxide and breaking it mechanically. For example, it is possible to add glass frit into the metal to be deposited (metal B). Said glass frit makes it possible to mechanically break the native oxide by means of thermal annealing. The electrical contact between the metal A and the metal B is thus significantly improved. This solution has in particular been mentioned in the article by S. Olweya's team having the title "fine-line Silver Pastes for Seed Layer Screen Printing with Varied Glass Content" published in the journal "Energy Procedia" in 2013.

Although these methods solve the problem addressed, they lead to additional steps in the method for producing the metal A/metal B stack, and require particular equipment or physical modifications of the raw materials. They thus generate a not insignificant extra cost, and significant logistical constraints.

BRIEF DESCRIPTION OF THE DRAWING FIGURES

FIG. 1A is an illustration of an example photovoltaic stack.

FIG. 1B is another example of a photovoltaic stack.

FIG. 2A is a diagram showing a cross section of an example photovoltaic module.

FIG. 2B is a diagram showing a cross section of the photovoltaic module of FIG. 2A after the deposition of metal B.

DETAILED DESCRIPTION

Figure 3:
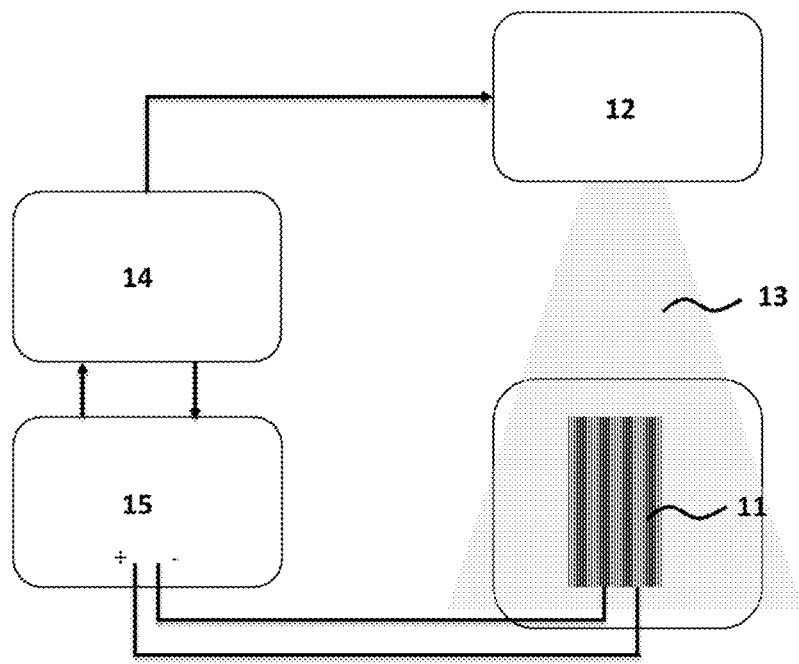
FIG. 3 is a diagram of an example device provided by embodiments of the present invention.

Embodiments of the present invention provide a method and a device that are capable of increasing the electrical conduction through a metal/native oxide/metal interface, using the step of characterizing the I(V) curve. Various embodiments share the I(V) measurement step for the photovoltaic device with a step of breakdown of the resistive electrical contact or contacts by applying a biasing voltage to said photovoltaic module under illumination.

More precisely, the invention relates to a method for optimizing the electrical conduction at the interface between two metals A, B when the first metal A has been exposed to the air, and when the surface thereof is covered by an electrically insulating native oxide prior to deposition of the second metal B.

In the remainder of the document, a photovoltaic module is formed by at least one photovoltaic cell. When the photovoltaic module is formed by a plurality of photovoltaic cells, said photovoltaic cells may be connected all in series or all in parallel, or may be connected according to a parallel/series or series/parallel architecture. The architecture retained depends essentially on the operating current I and voltage V required by the application sought.

A perfect module is defined as being a module which does not have any interface oxide. The perfect module is characterized by the optimal short-circuit current density $J_{SC\_opt}$ thereof, the surface area thereof, the number (NB) of cells making it up, and the architecture of said cells. The theoretical threshold current of the perfect module $I_{S\_th}$ is associated with $J_{SC\_opt}$.

A part of a photovoltaic module denotes a zone of said module that is made up by exclusively a part of the cells making it up. Advantageously, said part is made up only of complete cells, in order to be able to optimize the method for optimizing the electrical performance according to the invention.

All or part of the photovoltaic module is defined by:
the surface area S thereof
the short-circuit current density $J_{SC}$ thereof
the optimal short-circuit current density $J_{SC\_opt}$ thereof
the number (NB) of cells making it up
the architecture of said cells These characteristics make it possible to calculate the theoretical threshold current of the equivalent perfect module $I_{S\_th}$, which depends in particular on the optimal short-circuit current density $J_{SC\_opt}$. The perfect module equivalent to the photovoltaic module is a module having the same characteristics in terms of number of cells, architecture, surface area, active photovoltaic area ratio, and materials, but not having any interface oxide.

For example, when considering a photovoltaic module made up of photovoltaic cells which are all connected in parallel, the short-circuit current is calculated according to: $I_s=(S \times J_{sc} \times NB)$. When it is made up of photovoltaic cells which are all connected in series, the short-circuit current is calculated according to: $I_s=(S \times J_{sc}/NB)$. It is thus attempted, by virtue of the optimization method according to the invention, to minimize the difference between the value of the short-circuit current vs. the value of the theoretical short-circuit current $I_{S\_th}$. Ideally, the theoretical short-circuit current corresponds to the short-circuit current which it is wished to achieve after the optimization method.

For example, when considering a photovoltaic module made up of photovoltaic cells which are all connected in parallel, the theoretical short-circuit current is calculated according to: $I_{s\_th}=(S \times J_{SC\_opt} \times NB)$. When it is made up of photovoltaic cells which are all connected in series, the theoretical short-circuit current is calculated according to: $I_{s\_th}=(S \times J_{SC\_opt}/NB)$.

The concept of a voltage sweep is defined as being a succession of voltages (selected appropriately) applied to all or part of the photovoltaic module. Said voltage sweep starts with an initial voltage $V_I$ and ends with a limit voltage $V_L$, both of which are predetermined. It can be carried out having a constant voltage step, such that the voltage applied is written as $V_K=V_I+step*k$, where k represents the kth iteration of the application of the voltage during the voltage sweep. However, it can also be carried out at a step which is not constant, in order for example to reduce the interval between two successive voltages during the sweep. In the remainder of the document, the open-circuit voltage may be referred to as $V_{OC}$.

The method for optimizing the electrical performance according to one embodiment of the invention applies to all or part of a photovoltaic module. This optimization method results in a breakdown at the metal/oxide/metal interfaces. Said optimization method is characterized in that it comprises the following steps:

Step 1: Illuminating all or part of said photovoltaic module with a luminous flux controlled by a control module;

Step 2: Reverse-biasing the module by subjecting it to a voltage sweep ranging from an initial voltage $V_I=-V_{oc}/2$, to a limit bias voltage $V_L$ whose value depends on the mode of interconnection and on the number (NB) of cells forming all or part of said photovoltaic module.

The optimization method can be completed by the following additional steps:

Step A: calculating the theoretical threshold current $I_{s\_th}$ of all or part of the photovoltaic module, the value of which depends on the surface area S and the short-circuit current density $J_{SC\_opt}$ of all or part of the photovoltaic module, as well as the number (NB) of cells making up all or part of said photovoltaic module;

Step B: fixing the maximum value of the current that the biasing module can deliver, to the value of the theoretical threshold current $I_{s\_th}$;

Step C: verifying that the threshold current has been reached for at least three reverse-biasing voltages during the voltage sweep; if not, repeating the steps 1 and 2 described above.

When the photovoltaic module is made up of a single cell or a plurality of cells which are all connected in parallel:
the limit voltage $V_L$ is equal to $-V_{oc}$,
the theoretical threshold current is equal to $S \times J_{SC\_opt} \times NB$.

When the photovoltaic module is made up of a single cell or a plurality of cells which are all connected in series:
the limit voltage $V_L$ is equal to $-V_{oc} \times NB$,
the theoretical threshold current is equal to $S \times J_{SC\_opt}/NB$.

In some configurations, the method for optimizing the electrical performance was carried out by a sweep comprising at least 10 biasing voltages; this means that 10 reverse-biasing voltages were applied to the photovoltaic module.

The optimization method may be completed by a step of characterizing the electrical performance of all or part of said photovoltaic module, in particular in order to verify that the desired electrical performance has been achieved.

In some configurations, a device is provided to carry out the method for optimizing the electrical performance of a photovoltaic module. The device may include:
- a light source emitting a homogeneous and calibrated light beam;
- a first control module; and
- a second biasing module.

The biasing module may bias the photovoltaic module according to a succession of reverse-biasing voltages imposed by the control module.

It may be advantageous to apply the optimization method to only a part of the photovoltaic module. Indeed, some photovoltaic modules have operating voltages of above 50 V. In this case, it would be necessary to provide a device comprising a biasing module, the maximum output voltage of which is greater than 50 V. However, these voltage generators are not only bulky, but also require particular precautions for their use. It is therefore recommended to use generators having a low output voltage, and to optimize the photovoltaic module by parts, appropriately selected.

Regarding the optimization of photovoltaic modules dedicated to the reception of modulated light containing an item of information, it may be advantageous to optimize only a part of the photovoltaic module, in order to achieve the optimal operating voltage of said module while preserving the intrinsic characteristics of the module optimized for the reception of the modulated light.

The invention will now be described in greater detail by way of the description of FIGS. 1 to 4.

The invention relates to the optimization of the electrical conduction through the interface between two metals, by electrical measurement. A metal B (4) is deposited on a metal A (2). In general, the metal A (2) is initially deposited on a substrate (1). FIG. 1A is a structure diagram made up of a substrate (1) and two metal layers (2 and 4).

It is common to dissociate the steps of deposition of the metal A (2) from that of the metal B (2). This is in particular the case when it is desired to thicken the electrodes of a photovoltaic module in order to reduce the Joule losses and thus increase the yield of said module. A second step of metal deposition is also used in order to connect cells in series or in parallel, with the aim of controlling the voltage and current levels at the output of the photovoltaic modules. In these two cases, it is thus necessary to contact a metal A (2) having been exposed to the open air, with another conductor, the metal (B). However, some metals undergo surface oxidation in the open air. A thin layer of native oxide (3), of a few nanometers thickness, thus forms on the metal A (2).

FIG. 1B is a simplified diagram of the structure made up of the substrate (1), a metal A (2), the native oxide (3) thereof, and a metal B (4). In the majority of cases, the layer of native oxide (3) is electrically insulating. This is the case, for example, of contact between a metal B (4) of aluminum deposited on a metal A (2) of aluminum in order to achieve the interconnection of photovoltaic cells with one another, in parallel. FIG. 2A is a diagram showing a cross section of a portion of the photovoltaic module prior to deposition of the metal B. More precisely, it is a cross section of a portion of a photovoltaic cell (9) and of a portion of a rear contact collector bus (8). The photovoltaic cell (9) is made up of a glass substrate (1) on which the following are successively deposited:
- a transparent conductive oxide (5), for example a zinc oxide doped with aluminum;
- an active photovoltaic layer (6), for example a junction based on amorphous silicon;
- a metal electrode formed by a first aluminum metal A (2); of two insulating layers (71, 72) separated by an empty space (73).

The entire module shown in FIG. 2A is then exposed to ambient air (10). Native oxide (3) of aluminum then forms at the air (10)/metal A (2) interface. The thickness thereof is of the order of 4 to 5 nanometers. Said layer has a particularly high resistivity of $1 \times 10^{14}$ Ω·cm.

FIG. 2B is a diagram showing a cross section of a portion of the photovoltaic module following deposition of the metal B (4). The metal A (2) and the metal B (4) are separated by a thin layer of aluminum oxide (3). The electrical contact between the metal A (2) and the metal B (4) is therefore particularly resistive, which brings about a reduction in the electrical performance of the photovoltaic module.

In some configurations, the method ensures that the stack of FIG. 1B, present for example in FIG. 2B, has, as a minimum, a metal A (2)/native oxide (3)/metal B (4) interface which is not resistive or has the lowest resistivity possible, without the addition of additional production methods or equipment, and without modifying the raw material. By virtue of the invention, it is not necessary to progress under an inert or controlled atmosphere, or to treat the metal A (2) prior to deposition of the metal B (4).

The invention is based on sharing the step of I(V) measurement of a photovoltaic module which makes it possible to evaluate the electrical performance of said module under illumination, with a step of breakdown of the failed electrical contact or contacts containing a native oxide (3) at the interface between two metals, as shown for example in FIG. 2B. The I(V) measurement consists in applying a biasing voltage between the two terminals of the photovoltaic module, under illumination. Generally, the illumination is equivalent to 1 sun. The measurement is carried out by virtue of a voltage sweep. The current is measured for each of the voltages applied, all the recording points forming the I(V) curve. The minimum voltage and the maximum voltage applied depend on the characteristics of the module. This curve makes it possible to deduce the main parameters making it possible to evaluate the electrical performance of the photovoltaic module. This is thus a step which is carried out systematically at the end of the method for producing photovoltaic modules.

FIG. 3 is a diagram of the system that makes it possible to perform the I(V) measurements and thus, in the case of the invention, the breakdown of the metal A/native oxide/metal B interfaces. The system is made up of a light source (12) which emits a homogeneous and calibrated light beam (13), a first control module (14), and a second biasing module (15). The control module (14) makes it possible to control the light source (12) and the biasing module (15), as well as to process the information received by the biasing module (15). The biasing module (15), in turn, makes it possible to bias the photovoltaic module (11) according to a biasing voltage imposed by the control of the control module (14). For each biasing voltage, the biasing module (15) measures the current generated by the photovoltaic module (11) and sends the value to the control module (14). The control module (14) then processes all the information received by the biasing module (15), and derives therefrom the I(V) curve and the main parameters making it possible to evaluate the performance of the photovoltaic module.

By virtue of applying adequate biasing voltages to the photovoltaic module having contacts which fail in the presence of native oxides, the metal oxides are broken down. Thus, metal bridges are created across the layer of native oxide, which increases the associated conductivity until the expected I(V) characteristics are achieved which correspond to the characteristics which a person skilled in the art would know how to simulate. By way of example, for modules in series the short-circuit current density ($J_{sc}$) of the photovoltaic module must be equivalent to the current density ($J_{sc}$) of the photovoltaic module that a person skilled in the art would simulate, i.e. the optimal short-circuit current density $J_{sc\_opt}$.

However, the biasing of the photovoltaic module must take into account the characteristics thereof, in order not to break down the semi-conductive junctions of the solar cells, without which the photovoltaic module would no longer function.

---

1 Substrate
2 Metal A
3 Native oxide of metal A
4 Metal B
5 Transparent conductive oxide
6 Active photovoltaic layer
7, 71, 72 Electrically insulating layer
73 Empty space
8 Rear contact collector bus
9 Photovoltaic cell
10 Open air
11 Photovoltaic module
12 Light source
13 Calibrated light beam
14 Control and processing module
15 Biasing and measurement module
Curve A: I(V) prior to method of breakdown according to the invention
Curve B: Measurements during the method of breakdown according to the invention
Curve C: I(V) after method of breakdown according to the invention

---

Embodiment

Figure 4:
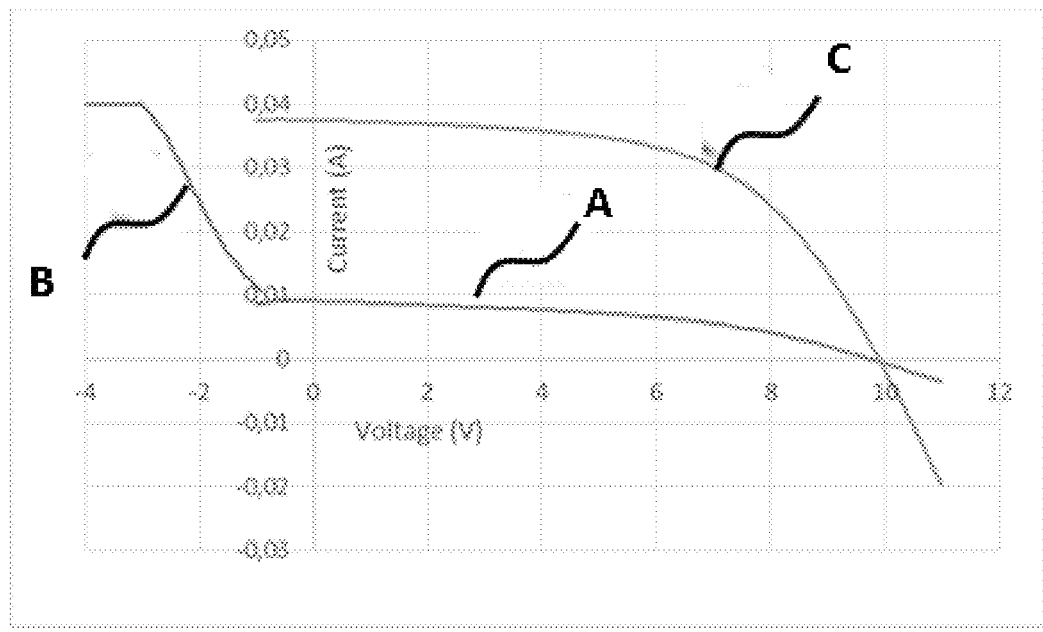
FIG. 4 is an example graph illustrating various I(V) curves includes those generated by embodiments of the present invention.

A specific example of optimizing the electrical conduction according to the method of the invention has been carried out on a semi-transparent photovoltaic module comprising 11 cells connected in series, the transparency rate of which is 50%. Curve A in FIG. 4 is the I(V) curve obtained before the method for optimizing the electrical performance by breakdown at the metal/oxide/metal interfaces according to the invention. A person skilled in the art knows to interpret, by virtue of these results, that the electrical performance of said photovoltaic module is poor, the form factor (for example less than 50%) and the short-circuit current being greatly impacted by high resistances within said device. Curve B of FIG. 4 shows the current and voltage measurements obtained by reverse-biasing of said module according to the method of the invention, while curve C is the I(V) curve obtained after the optimization method. Comparing curves A and C shows that the performances of said module have been very clearly improved, since the method of the invention has broken down the native oxides between metal A and metal B, and thus has improved the metal/metal electrical contacts within the device.

Embodiments of the invention thus make it possible to optimize the electrical conduction at the interface between two metals when the first metal A has been exposed to the air, and when the surface thereof is covered by an electrically insulating native oxide prior to deposition of the second metal B. The invention makes it possible to obtain a non-resistive metal A/metal B interface without adding additional production steps and without modifying the raw materials. It thus makes it possible to dispense with native oxides possibly formed at the surface of the metal, which may hamper the electrical conduction.

The invention claimed is:

1. A method for optimizing the electrical performance of at least a part of a photovoltaic module, the method including:
    illuminating at least part of said photovoltaic module with a luminous flux controlled by a control module;
    calculating a limit bias voltage based on a number of cells forming at least part of said photovoltaic module and a mode of interconnection between the cells; and
    reverse-biasing said photovoltaic module by subjecting it to a voltage sweep between an open-circuit voltage to the limit bias voltage,
    wherein the voltage sweep is performed according to a voltage step which reduces as the reverse-biasing voltage increases, in order to reach at least three biasing voltages generating a current that is at least equal to a threshold current.

2. The method of claim 1, further including:
    calculating a theoretical threshold current of at least a part of the photovoltaic module based on a surface area and an optimal short-circuit current density of the photovoltaic module;
    fixing a maximum biasing current value based on the theoretical threshold current; and
    verifying that the theoretical threshold current has been reached for at least three reverse-biasing voltages during the voltage sweep.

3. The method of claim 1, wherein the photovoltaic module includes a plurality of cells and the cells are connected in parallel.

4. The method of claim 1, wherein the photovoltaic module includes a plurality of cells and the cells are connected in series.

5. The method of claim 1, wherein at least ten reverse-biasing voltages are applied to the module during the voltage sweep.

6. The method of claim 1, further including verifying the electrical performance of at least part of the photovoltaic module.

7. A method for optimizing the electrical performance of at least a part of a photovoltaic module, the method including:
    illuminating at least part of said photovoltaic module with a luminous flux controlled by a control module;
    calculating a limit bias voltage based on a number of cells forming at least part of said photovoltaic module and a mode of interconnection between the cells;
    calculating a theoretical threshold current of at least a part of the photovoltaic module based on a surface area and an optimal short-circuit current density of the photovoltaic module;
    fixing a maximum biasing current value based on the theoretical threshold current;
    reverse-biasing said photovoltaic module by subjecting it to a voltage sweep between an open-circuit voltage to the limit bias voltage; and
    verifying that the theoretical threshold current has been reached for at least three reverse-biasing voltages during the voltage sweep.

8. The method of claim 7, wherein the photovoltaic module includes a plurality of cells and the cells are connected in parallel.

9. The method of claim 7, wherein the photovoltaic module includes a plurality of cells and the cells are connected in series.

10. The method of claim 7, wherein at least ten reverse-biasing voltages are applied to the module during the voltage sweep.

11. The method of claim 7, wherein the voltage sweep is performed according to a voltage step which reduces as the reverse-biasing voltage increases.

* * * * *